United States Patent [19]

Leonard et al.

[11] Patent Number: 4,893,076

[45] Date of Patent: Jan. 9, 1990

[54] PROXIMITY DETECTOR USING INDUCTIVE EFFECT ON OSCILLATING CIRCUIT THE CHARGE OF WHICH IS CONTROLLED BY A PULSE OF SHORT DURATION

[75] Inventors: Didier Leonard, Hiersac; Jean M. Periot, La Couronne; Pierre Petit, Champniers, all of France

[73] Assignee: La Telemecanique Electrique, France

[21] Appl. No.: 184,853

[22] Filed: Apr. 22, 1988

[30] Foreign Application Priority Data

Apr. 23, 1987 [FR] France .................................. 87 05961

[51] Int. Cl.⁴ .............................................. G01B 7/14
[52] U.S. Cl. ..................................... 324/207; 324/236
[58] Field of Search ............... 324/207, 208, 234, 236, 324/327, 67; 331/65; 340/547, 551

[56] References Cited

U.S. PATENT DOCUMENTS

| 4,267,522 | 5/1981 | Periot ................................ 324/327 X |
| 4,446,627 | 5/1984 | Lovrenich ....................... 324/227 X |
| 4,560,929 | 12/1985 | Meluyk ............................. 324/207 |
| 4,611,127 | 9/1986 | Ibrahim et al. .................. 324/236 X |
| 4,618,835 | 10/1986 | Wilson ............................. 324/207 X |

FOREIGN PATENT DOCUMENTS 2604251 3/1988 France ................................ 324/207

Primary Examiner—Reinhard J. Eisenzopf
Assistant Examiner—Warren S. Edmonds
Attorney, Agent, or Firm—William A. Drucker

[57] ABSTRACT

A proximity detector is provided with an oscillating circuit generating cyclically an unsustained pseudo-oscillation. The detector includes a processing circuit having a comparator which compares the relaxation voltage of the oscillating circuit with a predetermined threshold and a logic circuit which generates control pulses with low duty ratio for a switch in series with the oscillating circuit and also an output signal as a function of the measurement pulses delivered by the comparator. The closure duration of the switch is substantially equal to half the pseudo-oscillation period.

5 Claims, 2 Drawing Sheets

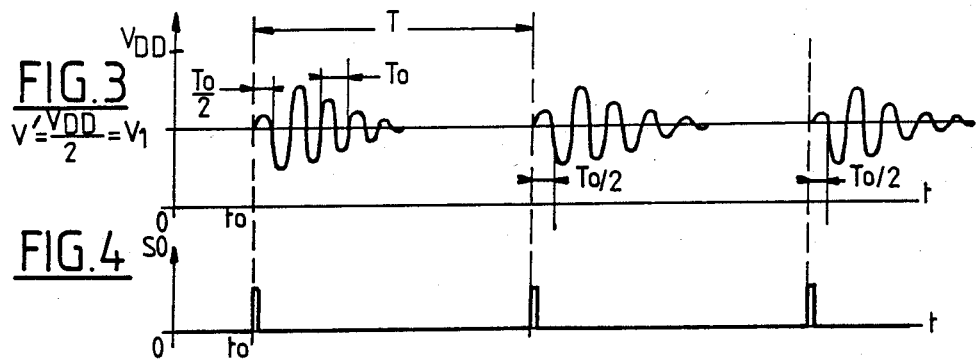
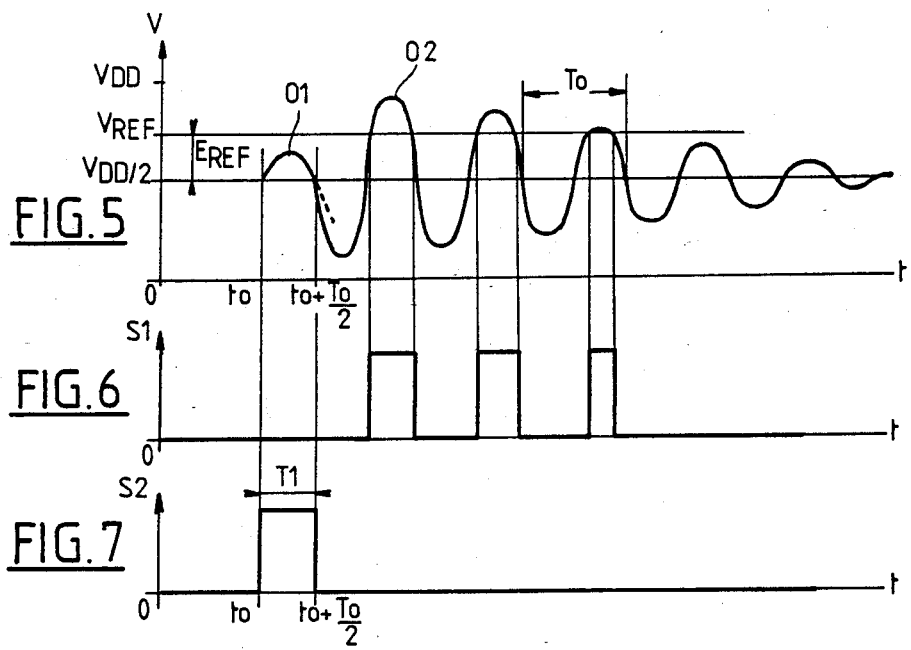

PROXIMITY DETECTOR USING INDUCTIVE EFFECT ON OSCILLATING CIRCUIT THE CHARGE OF WHICH IS CONTROLLED BY A PULSE OF SHORT DURATION

BACKGROUND OF THE INVENTION

1. Field of the Invention

The present invention relates to a proximity detector having an oscillating circuit which generates cyclically an unsustained pseudo-oscillation.

2. Description of the Prior Art

Such a proximity detector is described in the French patent application FR No. 86 13359 of Sept. 19th 1986 and includes an oscillating circuit having a capacitor and a coil which is influenced by an object to be detected. The oscillating circuit is connected to an energy source through a static switch driven by control pulses generated by a processing circuit including more particularly a comparator and a logic circuit.

Depending on whether the switch is closed or open and as a function of the state of the control pulses, the oscillating circuit is charged or respectively discharged. During pseudo-oscillation for discharging the oscillating circuit, a comparator compares its relaxation voltage with a threshold so as to generate measurement pulses which are representative of the proximity of an electrically conducting object and which are transmitted to the logic circuit for processing thereby.

This proximity detector has the advantage of making it possible to detect even very close objects while facilitating direct processing in digital form of the analog proximity information.

It seems however desirable to reduce the consumption of an inductive proximity detector of the type described so as to be able to construct its processing circuit in integrated circuit form, particularly using MOS technology. In addition, it would be advantageous to be able to correct in such a detector the dispersion and variations affecting the characteristics of the oscillating circuit particularly the inductances of the coils. The purpose of the invention is more particularly to respond to these requirements in a proximity detector of the above mentioned type.

SUMMARY OF THE INVENTION

According to the invention, in such a proximity detector, the logic circuit delivers control pulses with a low duty cycle, the closure time of the switch being substantially equal to half the pseudo-oscillation period of the oscillating circuit.

Thus, the duration of the energy pulse required for charging the oscillating circuit is shortened and optimized, while benefiting at the beginning of relaxation from a voltage peak value substantially twice greater than that of the pulse which previously charged the oscillating circuit.

Furthermore, a pulse having the above mentioned duration has the advantage of making the peak value of the voltage insensitive to small variations of duration about the half period.

The detection distance of the proximity detector is thus not affected by the small fluctuations of the excitation duration inherent in the electronic components used.

The processing circuit may include means for detecting the passage of the relaxation voltage V of the oscillating circuit to a value V' and logic means adapted for generating the control pulse, the detection means being associated with logic means so as to stop the control pulse the first time that V passes through the value V'.

The end of charge voltage V' is a voltage substantially equal to voltage V1 to which the oscillating circuit is referenced. The result is advantageously that the duration of the energy pulse which charges the oscillating circuit is adjusted automatically and simply by the processing circuit as a function of the characteristics of the oscillating circuit.

It is moreover advantageous to reference the oscillating circuit to a potential V1 between the high point $V_{DD}$ and the low point 0 volt of the power supply, V1 being preferably substantially equal to $V_{DD/2}$ at least during discharge of the oscillating circuit. Thus, the dischage pseudo-oscillation of the circuit remains always positive and less than $V_{DD}$ while having the greatest possible amplitude in the limit of the supply voltage.

BRIEF DESCRIPTION OF THE DRAWINGS

Other features and advantages of the invention will be clear from the following description of a non limitative example, illustrated by FIGS. 1 to 8.

FIG. 3 shows the successive cycles for charging and discharging the oscillating circuit of the detector;

FIG. 4 shows the pulses for initializing the cycles;

FIGS. 5 to 7 show, for a charge-discharge cycle of the oscillating circuit, respectively the relaxation voltage of said circuit, the output signal of the comparator and the control pulse generated by the processing circuit.

DESCRIPTION OF THE PREFERRED EMBODIMENT

Figure 1:
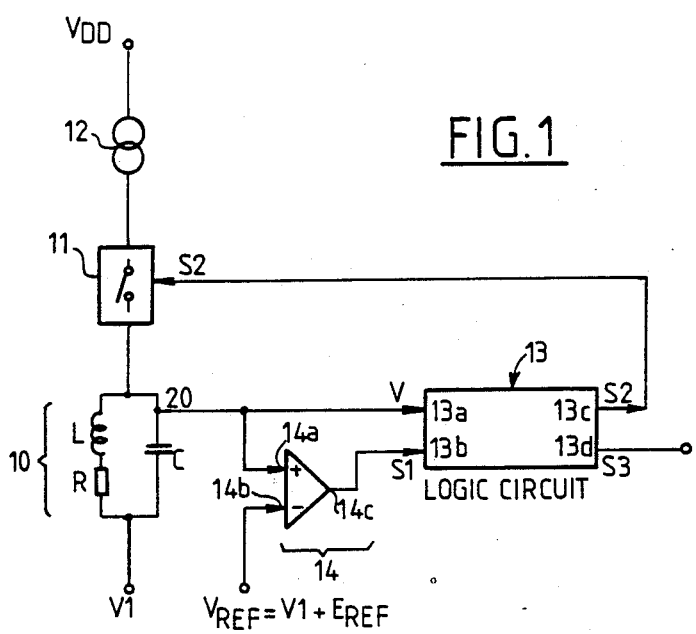
FIG. 1 shows schematically an inductive proximity detector in accordance with the invention.

The inductive proximity detector of FIG. 1 includes an oscillating or resonating circuit 10 having an inductance coil L in parallel with a capacitor C. A resistor R representing the losses of the oscillating circuit is in series with the coil. The inductance of the coil is influenced by the approach of electrically conducting objects.

The oscillating circuit 10 is connected, on one side, by a series switch 11 to a constant current source 12 fed by a DC voltage $V_{DD}$ and, on the other side, the oscillating circuit has a reference point at a voltage V1 which is preferably substantially equal to $V_{DD/2}$. The voltage V1 could however, in a variant be zero or slightly greater than zero during charging of the oscillating, provided that it is substantially equal to $V_{DD/2}$ during discharging of the oscillating circuit.

The proximity detector further includes a processing circuit having a logic circuit 13 and a comparator 14. A hot point 20 of the oscillating circuit 10 is connected both to an input 13a of the logic circuit 13 and to a signal input 14a of the analog comparator 14; to these inputs 13a, 14a are therefore applied the charge and respectively discharge voltage of the oscillating circuit during closure and respectively opening of the switch 11. The different components of the proximity detector are advantageously formed as an integrated circuit.

To the threshold input 14b of the comparator is applied a voltage $V_{REF}$, whereas the output 14c of the capacitor is connected to a second input 13b of the logic circuit 13 (signal S1). An output 13c of circuit 13 is connected to a control electrode of switch 11 (signal S2), whereas another output 13d of circuit 13 may be connected to an external circuit having a a digital input (signal S3).

Figure 2:
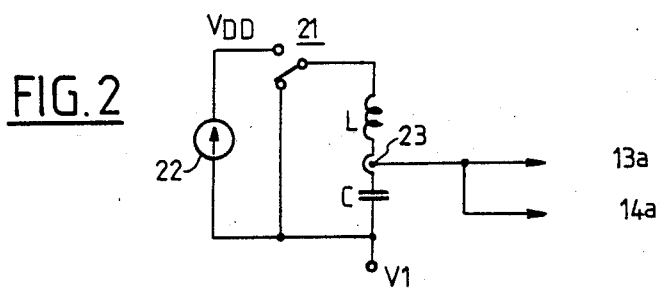
FIG. 2 shows a variant of the oscillating circuit of the proximity detector.

In the variant shown in FIG. 2, the oscillating circuit is a series resonating circuit connected to a constant voltage source 22 by a switch 21. A current sensor 23 is connected to the middle point of the oscillating circuit and to the respective inputs 13a, 14a of the logic circuit and of comparator 14.

the trend of the charge-discharge cycles of the oscillating circuit 10 is illustrated in FIG. 3. It will be noted that the low potential V1 of the oscillating circuit is chosen equal to $V_{DD/2}$ for optimizing the oscillations of the relaxation voltage V without this latter becoming negative while remaining in the range of the power supply potential. The threshold $V_{REF}$ is greater than $V_{DD/2}$ by a suitably chosen value $E_{REF}$ (FIG. 5). If we assume that switch 11 is closed at time $t_o$ by the logic circuit 13, the current source 12 charges the oscillating circuit in accordance with the half wave concerned. The voltage at the terminals of the oscillating circuit returns to the value $V_{DD/2}$ at time $t_o+T_{o/2}$ and the processing circuit then detects this first passage.

The oscillation frequency $F_o=1/T_o$ of circuit 10 is for example of the order of 50 KHz to 2 MHz and the recurrence frequency $F=1/T$ of the charge-discharge cycles is about 20 to 200 times less than $F_o$ depending on the speed and the consumption required by the proximity detector. The frequency F is determined by pulsed signal So generated by an oscillator not shown.

Figure 8:
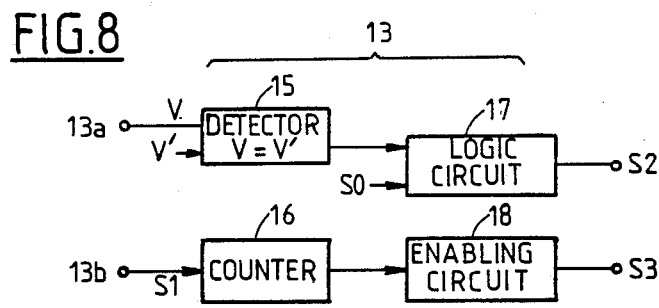
FIG. 8 shows one embodiment of the processing circuit.

In the embodiment shown in FIG. 8, the logic circuit 13 has a detector 15 detecting the passage of voltage V through the value V' here equal to $V_{DD/2}$ and a counter 16 receiving the measurement pulses S1; the output of detector 15 is connected to a logic circuit 17 which delivers the control pulses S2 at its output; the counter 16 is further connected to an enabling circuit 18 which delivers the signal S3.

The operation of the proximity detector will be explained with reference to FIGS. 5 to 7 which show a charge-discharge cycle of the oscillating circuit. Only a small number of oscillations have been shown for the sake of clarity.

Before time $t_o$ switch 11 is open. At time $t_o$, signal SO is generated and pulse S2 goes high (FIG. 7), so that switch 11 is closed. The constant current source 12 charges the oscillating circuit with a wave 01 which begins to oscillate about the value $V_{DD/2}$.

The first time that this pseudo-oscillation 01 passes through value $V_{DD/2}$, namely at time $t_o+T_{o/2}$ the output of detector 15 causes the signal S2 of logic 17 to change state. Thus, the control signal S2 comes back to the low state (FIG. 7). Switch 11 is opened substantially at the same time $t_o+T_{o/2}$ so that the oscillating circuit may begin to discharge under optimum amplitude conditions.

The relaxation voltage V of circuit 10 then oscillates as shown by curve O2 (FIG. 5) whose first half wave begins with a slope and a peak value twice those of the half wave 01. Comparator 14 delivers a rectangular pulse S1 whenever 02 exceeds the value $V_{DD/2}+E_{REF}$ (see FIG. 6). The pulses S1 are of decreasing width and their leading edges are counted by counter 16. The output of counter 16 can be enabled by the enabling circuit 18 for example after two or three identical measurements for delivering the output signal S3 of the proximity detector. the output of counter 16 could further serve for generating the signal S0.

What is claimed is

1. An inductive proximity detector including:
   i- an oscillating circuit comprising a coil which is influenced by an object to be detected and a capacitor, said oscillating circuit having a predetermined pseudo-oscillation period and a hot point terminal ;
   ii- a power supply source and controllable switch means connecting the power supply source to the hot point terminal of the oscillating circuit, said switch means having a control input ;
   iii- logic circuit means having an output connected to said control input and generating square wave signals during predetermined periodic time intervals, said pulses opening the switch means during said intervals, said logic circuit means having a further output on which a measurement signal is produced, and
   iv- comparator means comparing the voltage at the hot point terminal of the oscillating circuit with a predetermined voltage threshold, said comparator means having an output ;
   v- said logic circuit means having an input connected to the hot point of said oscillating circuit and a further input connected to the output of the compatator means ;
   vi- said predetermined time intervals being substantially equal to half the said pseudo-oscillation period.

2. The proximity detector as claimed in claim 1, wherein said logic circuit means includes detecting means for detecting the passage of the voltage at the hot point terminal of the oscillating circuit to an end of charge value and means controlled by said detecting means for causing the said time interval to end at the first time that said voltage passes through said end of charge value.

3. The proximity detector as claimed in claim 2, wherein the oscillating circuit has a reference point at a predetermined reference potential and said end of charge value is substantially equal to said predetermined reference potential.

4. The proximity detector as claimed in claim 1, wherein said power supply source has a hot point and a reference point and said predetermined reference potential of the oscillating circuit is comprised between the respective potentials at the hot point and the reference point of the power supply source.

5. The proximity detector as claimed in claim 4, wherein said predetermined potential is substantially half the potential at said hot point of the power supply source.

* * * * *